United States Patent [19]

Murasato et al.

[11] Patent Number: 5,896,284

[45] Date of Patent: Apr. 20, 1999

[54] SWITCHING POWER SUPPLY APPARATUS WITH A RETURN CIRCUIT THAT PROVIDES A RETURN ENERGY TO A LOAD

[75] Inventors: Michihisa Murasato; Mitsuru Kanno; Sadaharu Tamoto, all of Kawasaki, Japan

[73] Assignees: Nippon Steel Corporation; Yutaka Electric Mfg. Co., Ltd., both of Japan

[21] Appl. No.: 08/689,232

[22] Filed: Aug. 6, 1996

[30] Foreign Application Priority Data

Aug. 11, 1995 [JP] Japan ................................. 7-227347

[51] Int. Cl.$^6$ ................ H02M 7/00; G05F 1/577; G05F 1/40
[52] U.S. Cl. ............... 363/124; 323/282; 323/267
[58] Field of Search ................. 323/282, 267; 363/124

[56] References Cited

U.S. PATENT DOCUMENTS 3,736,495  5/1973  Calkin et al. .................. 323/289
4,363,067  12/1982  Randomski ...................... 361/91

FOREIGN PATENT DOCUMENTS

| A-53-132732 | 11/1978 | Japan . |
| 54-114166 | 9/1979 | Japan ............... H03K 17/56 |
| A-3-178570 | 8/1991 | Japan . |
| A-3-218258 | 9/1991 | Japan . |

Primary Examiner—Peter S. Wong
Assistant Examiner—Bao Q. Vu
Attorney, Agent, or Firm—Pollock, Vande Sande & Amernick

[57] ABSTRACT

A switching power supply apparatus which effectively utilizes energy accumulated in a leak inductance of a circuit to enhance the efficiency. The switching power supply apparatus having a switch element on/off controlled by a driving signal generated from a driver circuit, wherein a first capacitor and a first diode are inserted in series between both terminals of the switch, and a second capacitor and a second diode are further connected in series between a connecting point of the first capacitor and the first diode and a grounding terminal of the switch element to use charges accumulated on the second capacitor as a voltage source.

6 Claims, 17 Drawing Sheets

SWITCHING POWER SUPPLY APPARATUS WITH A RETURN CIRCUIT THAT PROVIDES A RETURN ENERGY TO A LOAD

BACKGROUND OF THE INVENTION

1. Field of the Invention

The present invention relates to a switching power supply apparatus for switching an input direct-current (DC) voltage with a switching element to convert the input DC voltage into an output DC voltage having a value different from the input voltage.

2. Description of the Related Art

Generally, switching power supply apparatuses are known as DC-DC converters for converting an input DC voltage into an output DC voltage having a desired value.

FIG. 1 is a block diagram conceptually illustrating an example of a conventional DC-DC converter. In FIG. 1, a switching element 1 is on/off controlled by a driving signal 3 generated by a switching element driver circuit 2 to switch on or off a DC voltage of a DC power supply 4. A rectangular wave voltage 5 generated by the switching is converted into a DC voltage by a rectifying/smoothing circuit 6 and outputted from output terminals 7, 8. A part of the output voltage is fed back to the driver circuit 2 such that the driver circuit 2 outputs the driving signal 3 in accordance with the output voltage. For the switching element 1, an FET (field effect transistor), a bipolar transistor, or other semiconductor switching elements may be used.

Switching power supply apparatuses as described above have been widely utilized in recent years as power supply circuits for a variety of electronic systems such as information processing systems and so on because of their features of compact size and high efficiency.

FIG. 2 illustrates an example of a specific configuration of the circuit shown in FIG. 1, where portions having the same functions as those in FIG. 1 are designated by the same reference numerals. Also, FIG. 2 illustrates a converter by using an FET as a switching element 1.

In FIG. 2, a driving signal 3 outputted from a driver circuit 2 is applied to a control terminal of the switching element 1 (the gate terminal of the FET) through a capacitor 9, a resistor 10 and a resistor 11 for a stable switching operation. The switching element 1 turns on when the driving signal 3 is at a positive voltage and turns off when the driving signal 3 is at zero voltage.

The on/off operation of the switching element 1 switches a current from a DC power supply 4 through a leak inductance 12 and a primary winding of a transformer 13, whereby a rectangular wave voltage is generated on the secondary side of the transformer 13. The rectangular wave voltage is converted into a DC voltage by a rectifying/smoothing circuit 6 including a diode 14 and a capacitor 15, and then outputted from output terminals 7, 8.

Generally, it is known that when a higher switching frequency is employed in a switching power supply apparatus, components thereof can be reduced in size. However, as the switching frequency becomes higher, the switching power supply apparatus tends to increase power loss in a voltage converting operation to such a degree that the power loss caused by an increase in the switching frequency reaches an amount which cannot be neglected with respect to the volume of the apparatus. Therefore, a switching frequency is restricted by a certain upper limit.

The power loss as mentioned above is predominantly caused by loss due to the overlapping of voltages and currents generated during a certain time period in a state transition of the switching element 1 from ON to OFF and from OFF to ON and loss due to the charging and discharging of a parasitic capacitance of the switching element 1, in addition to loss due to the capacitor and diode constituting the rectifying/smoothing circuit 6. For reducing the power loss when a switching operation is performed, it is necessary to reduce a transition time of the switching element 1 as much as possible. Conventionally, a variety of circuits have been proposed to meet this requirement.

FIG. 3 illustrates an example of such proposed circuits which is disclosed in JP-A-53-132732.

In FIG. 3, a transformer 13 is provided with a tertiary winding 16, one end of which is connected to a control terminal of a switching element 1 through a resistor 17 and a capacitor 18.

According to this configuration, a flyback pulse, which is a negative voltage generated in the transformer 13 simultaneously with the switching element 1 turning OFF, is applied from the tertiary winding 16 to the control terminal of the switching element 1 through the resistor 17 and the capacitor 18, thereby promptly extracting charges accumulated in the parasitic capacitance of the switching element 1. In this way, the switching element 1 can promptly change from an ON state to an OFF state.

However, when the switching transition time is reduced as described above, a current flowing through the switching element 1 abruptly decreases when the switching element 1 turns OFF, so that energy accumulated in a leak inductance 12 and so on concentrates on the parasitic capacitance of the switching element 1 to abruptly generate a large surge voltage between the drain terminal and the source terminal of the switching element (FET) 1. Such a surge voltage, which causes noise, not only affects other circuit portions but also exceeds the break-down voltage of the switching element 1 depending upon the magnitude of accumulated energy, resulting in breakage of the switching element 1 in some cases. Further, since a major portion of the accumulated energy is eventually consumed by the switching element 1 as loss, the temperature of the switching element 1 rises to sometimes lead to breakage of the switching element 1. These problems are particularly significant in low voltage and large current applications even if switching power supply apparatuses have the same power capacity.

To solve the above-mentioned problem, a switching power supply apparatus having a snubber circuit 19 or 20 has been proposed as illustrated in FIG. 4.

In FIG. 4, the snubber circuit 19, composed of a diode 21, a capacitor 22, and a resistor 23, is arranged in parallel with a primary winding of a transformer 13. Additionally, the snubber circuit 20, composed of a diode 24, a capacitor 25, and a resistor 26, is arranged in parallel with the switching element 1.

According to the above configuration, a surge voltage generated at the time the switching element 1 turns OFF is absorbed by the capacitor 22 through the diode 21 and is consumed by the resistor 23 in the snubber circuit 19. Likewise, a surge voltage generated on the drain side of the switching element 1 is absorbed by the capacitor 25 through the diode 24 and is consumed by the resistor 26 in the snubber circuit 20. In this way, the snubber circuits can reduce surge voltages and noise, and moreover protect the switching element 1 from breakage.

However, the circuit illustrated in FIG. 3 requires the tertiary winding 16 as a power supply for extracting accumulated charges in the switching element 1. If the tertiary winding 16 is not built in the switching power supply apparatus, a dedicated power supply must be externally provided, thus causing several problems such as increased power consumption, increased cost of parts, reduced efficiency, and so on.

On the other hand, when the snubber circuits 19, 20 are arranged as illustrated in FIG. 4, although they provide a large energy absorbing effect, the absorbed energy is consumed by the resistors 23, 26, thus causing problems such as a reduced efficiency, increased capacity and a larger cooling device, and so on.

Some switching power supply apparatuses have both a positive voltage output and a negative voltage output. This type of switching power supply apparatuses will hereinafter be called the "bipolar switching power supply apparatus".

FIG. 5 is a block diagram conceptually illustrating an example of a conventional bipolar switching power supply apparatus.

On a positive voltage output side in FIG. 5, a switching element 51 is on/off controlled by a driving signal 53 generated by a switching element control circuit 52 in order to switch a DC voltage from a DC power supply 54. A rectangular wave voltage 55 generated by the switching is converted into a DC positive voltage by a rectifying/smoothing circuit 56 and outputted from output terminals 57, 58. A part of the output voltage is fed back to the switching element control circuit 52 such that the switching element control circuit 52 outputs the driving signal 53 in accordance with the output voltage.

On a negative voltage output side in FIG. 5, a switching element 59 is on/off controlled by a driving signal 61 generated by a switching element control circuit 60 in order to switch the DC voltage from the DC power supply 54. A rectangular wave voltage 62 generated by the switching is converted into a DC negative voltage by a rectifying/smoothing circuit 63 and outputted from terminals 64, 58. A part of the output voltage is fed back to the switching element control circuit 60 such that the control circuit 60 outputs the driving signal 61 in accordance with the output voltage.

FIG. 6 illustrates an example of a specific configuration of the circuit shown in FIG. 5, where parts having the same functions as those in FIG. 5 are designated by the same reference numerals. Also, FIG. 6 illustrates a bipolar switching power supply apparatus which employs bipolar transistors (hereinafter simply called the "transistors") for switching elements 51, 59.

In the illustrated circuit, a single DC power supply 54 is shared by positive and negative voltage outputs, and a buck chopper switching power supply circuit is used for the positive voltage output while a buck-boost chopper switching power supply circuit is used for the negative voltage output.

A rectifying/smoothing circuit 56 is composed of a flywheel diode 65, a choke coil 66, and a capacitor 67, while a rectifying/smoothing circuit 63 is composed of a flywheel diode 69, a choke coil 68, and a capacitor 70.

In FIG. 6, a driving signal 53, outputted from a control circuit 52, is applied to a control terminal of a switching element, i.e., the base terminal of the transistor 51. The transistor 51 turns ON when a forward bias is applied at the base terminal thereof by the driving signal 53, and turns OFF if no bias is applied by the driving signal 53.

On the positive voltage output side, the transistor 51 is switched in response to the driving signal 53 created by the control circuit 52 in order to switch an input voltage from the DC power supply 54 to stabilize an output voltage. When the transistor 51 turns ON, the input voltage supplies energy to the choke coil 66, the capacitor 67, and a load externally connected to the output terminals 57, 58. In this case, the energy is accumulated in the choke coil 66 by a current flowing through the choke coil 66.

Next, when the transistor 51 turns OFF, the energy accumulated in the choke coil 66 is supplied through the flywheel diode 65 to the capacitor 67 and to the load externally connected to the output terminals 57, 58. By the foregoing operations, a target positive voltage output is generated.

On the negative voltage output side, the transistor 59 is switched in response to a driving signal 61 created by a control circuit 60 in order to switch an input voltage from the DC power supply 54 to stabilize an output voltage. When the transistor 59 turns ON, a current flows from the DC power supply 54 through the transistor 59 and the choke coil 68, whereby energy is accumulated in the choke coil 68.

Next, when the transistor 59 turns OFF, the energy accumulated in the choke coil 68 is supplied through the flywheel diode 69 to the capacitor 70 and to a load externally connected to the terminals 64, 58. By the foregoing operations, a target negative voltage output is generated. In this way, the bipolar switching power supply apparatus is configured for generating both positive and negative outputs.

In the bipolar switching power supply apparatus configured according to the prior art as described above, although the DC power supply 54 is shared by the positive and negative voltage output circuits, the positive and negative voltage output sides respectively have their own switching power supply circuits. For this reason, each of the positive and negative voltage output sides must be provided with a relatively expensive control circuit, a switching element, an inductor element, and so on exclusively for its use, so that the cost required by the manufacturing of the associated circuits increases substantially proportional to the number of output circuits. In addition, since the control circuit is also composed of a large number of elements, a plurality of such control circuits, when incorporated in a single switching power supply apparatus, result in a complicated circuit configuration as a whole.

Generally, negative voltage outputs are often used in power supply applications for driving a microcomputer, for communications, and so on, and most of these applications require small output currents. However, the conventional bipolar switching power supply apparatus described above with reference to FIG. 6 is effective when large currents are required on both the positive and negative voltage output sides. Unfortunately, since no appropriate alternative circuit technique is available for providing a small output current on the negative voltage output side, the foregoing conventional bipolar switching power supply apparatus has been obliged to be used even for the small current applications.

SUMMARY OF THE INVENTION

The present invention has been made to solve the problems as mentioned above. Thus, it is an object of the present invention to provide a switching power supply apparatus which is capable of absorbing energy accumulated in a leak inductance of a circuit constituting the power supply apparatus to effectively utilize the absorbed energy.

It is another object of the present invention to provide a simple and inexpensive switching power supply apparatus which eliminates a complicated control circuit and is suitable for use in applications where one of a positive voltage output circuit and a negative voltage output circuit is required to have a small output current.

To achieve the above objects, a switching power supply apparatus according to the present invention comprises switch means having at least a first terminal and a second terminal for switching a voltage applied between the first terminal and the second terminal to generate an alternate current voltage; a rectifying/smoothing circuit for rectifying and smoothing the alternate current voltage generated by the switch means; at least a first capacitor and a first diode connected in series between the first terminal and the second terminal of the switch means. The first diode has a first terminal and a second terminal, the first terminal of the first diode is connected to the second terminal of the switch means; and at least a second diode and a second capacitor are connected in series between the second terminal of the first diode and the second terminal of the switch means.

When the switching element switches from ON to OFF, an electromotive force is generated from energy accumulated in a leak inductance of the circuit to cause a voltage between the first terminal and the second terminal of the switching element to abruptly rise. However, with the above-mentioned configuration, the first diode turns ON to enable the first capacitor to absorb the energy, thus suppressing the abrupt rise of the voltage. Then, as the electromotive force decreases, the second diode turns ON to cause charges accumulated on the first capacitor to flow into the second capacitor to increase a terminal voltage of the switching power supply apparatus which, in turn, can be utilized as an auxiliary power supply.

DESCRIPTION OF THE PREFERRED EMBODIMENTS

Figure 1:
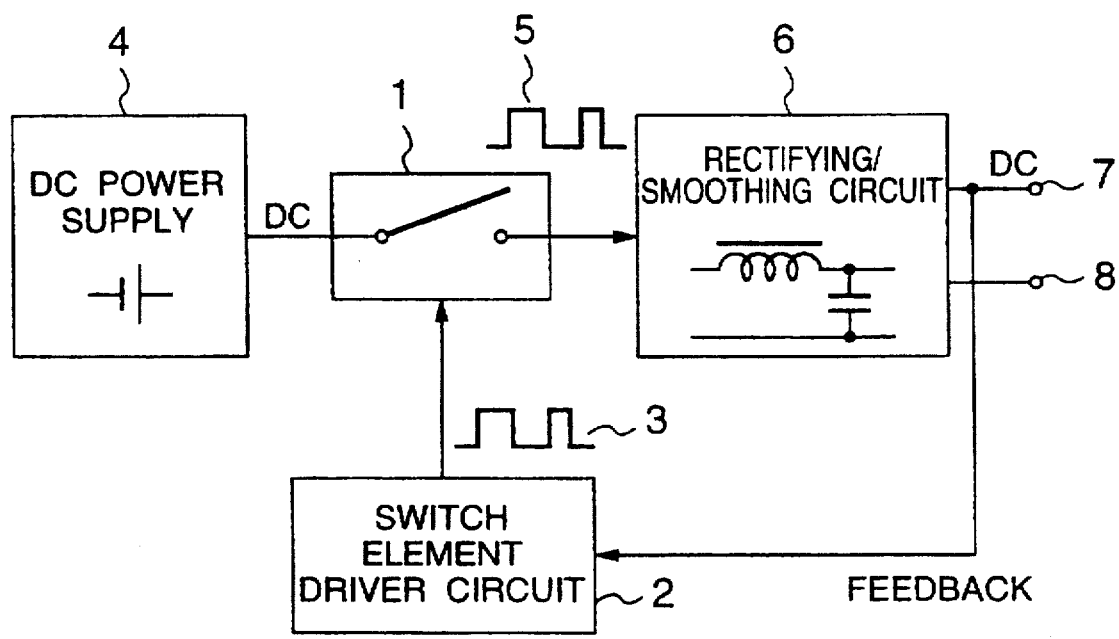
FIG. 1 is a block diagram illustrating a conventional switching power supply apparatus.
Figure 2:
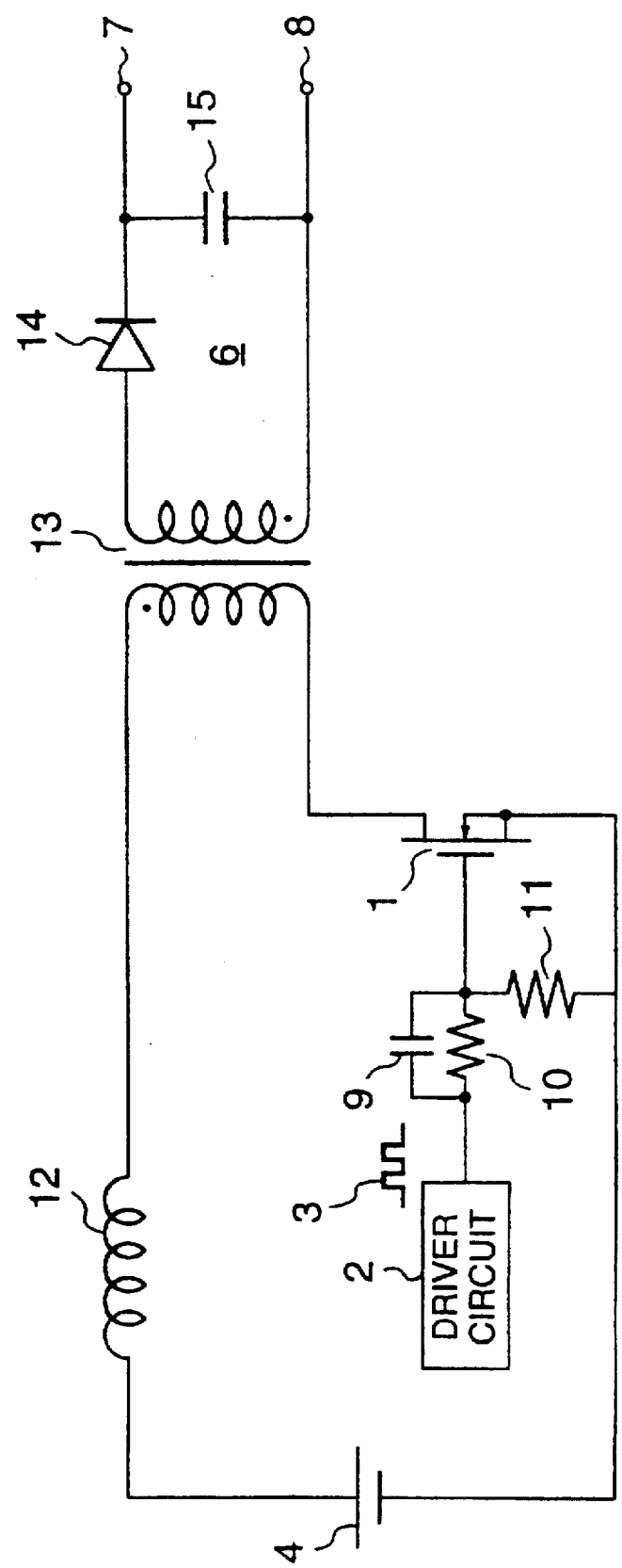
FIG. 2 is a circuit diagram illustrating an exemplary configuration of a conventional switching power supply apparatus.

Embodiments of the present invention will hereinafter be described with reference to the accompanying drawings. Parts having substantially the same functions in various drawings are designated by the same reference numerals.

Figure 7:
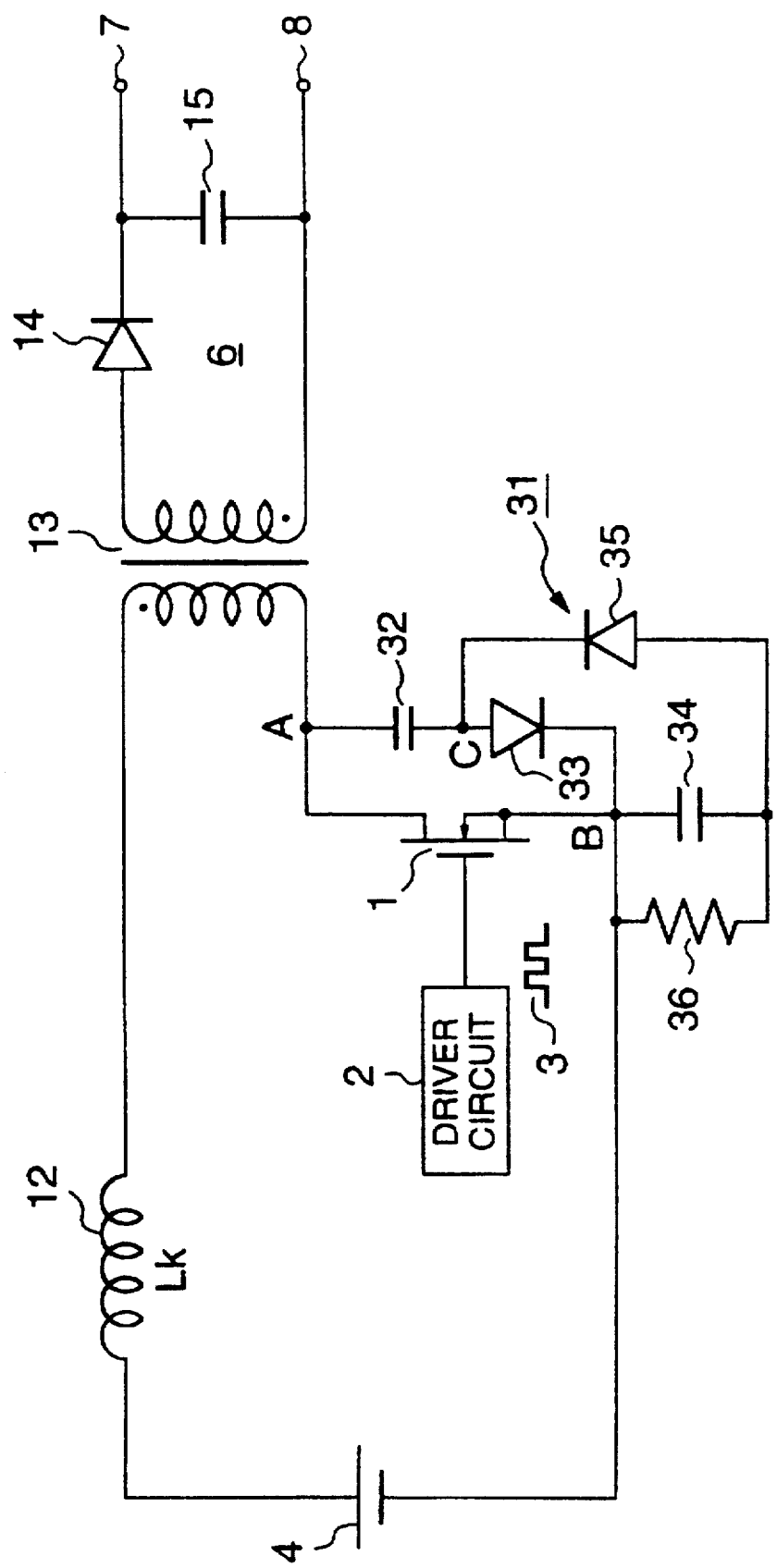
FIG. 7 is a circuit diagram illustrating a switching power supply apparatus according to a first embodiment of the present invention.

FIG. 7 illustrates a first embodiment of a switching power supply apparatus according to the present invention.

In FIG. 7, a first capacitor 32 and a first diode 33 are connected in series between the drain (point A) and the source (point B) of an FET as a switching element 1, and a second diode 35 and a second capacitor 34 are connected in series between a connecting point of the first capacitor 32 and the first diode 33 (point C) and the point B. These capacitors 32, 34 and diodes 33, 35 constitute an auxiliary power supply circuit 31. Reference numeral 36 designates a load connected to the switching power supply apparatus. While the load is shown here as a resistive load, a capacitive load or the like may also be connected to the switching power supply apparatus. Also, a resistor may be arranged in series with the first capacitor 32 and the first diode 33.

The current direction of the diode 33 is the same as the current direction of the switching element 1, whereas the current direction of the diode 35 is in the opposite direction.

Next, the operation of the foregoing configuration will be described. In the circuit of the first embodiment, energy accumulated in a leak inductance 12 is absorbed by the auxiliary power supply circuit 31 and eventually accumulated in the capacitor 34 such that the charged voltage is supplied to and utilized by the load 36.

The switching element 1 repeats ON/OFF operations in response to a driving signal 3 from a driver circuit 2. A current flowing through the switching element 1 during ON state simultaneously accumulates energy in the leak inductance 12 in the circuit. An accumulated energy amount E is expressed by:

$$E = \tfrac{1}{2}(L_K \times I^2)$$

where $L_K$ is the inductance of the leak inductance 12, and I is the current flowing through the switching element 1.

When the switching element 1 switches from ON state to OFF state, the current flowing through the circuit abruptly decreases, so that the energy accumulated in the leak inductance 12 cannot maintain the state expressed by the above equation, and an electromotive force is generated in the circuit forming the leak inductance 12. This electromotive force causes a drain-source voltage (between the points A and B) of the switching element 1 to abruptly rise. As a result, a current flows through the capacitor 32 and the diode 33, and the capacitor 32 absorbs the energy accumulated in the leak inductance 12. This causes a voltage between terminals of the capacitor 32 to rise together with the drain-source voltage. The speed of the voltage rise is slowed down due to the capacitor 32 absorbing the energy accumulated in the leak inductance 12, thus restraining an abrupt voltage rise.

The voltage rise slow-down effect is equivalent to that produced by a snubber circuit in the prior art, where an energy absorbing amount is larger as the capacitor 32 has a larger capacitance, and the voltage rise is further slowed down. In this way, it is possible to prevent the switching element 1 from being broken due to the voltage rise and to reduce a surge voltage which is the cause of noise.

Afterward, when the energy accumulated in the leak inductance 12 has been exhausted to reduce the electromotive force, the drain-source voltage of the switching element 1 is also reduced. In this event, the voltage between the terminals of the capacitor 32 is held at a maximum voltage because of a non-linear characteristic of the diode 33 connected in series therewith. However, since the drain terminal of the switching element 1 is equipotential with one terminal of the capacitor 32 (point A), a potential at the other terminal of the capacitor 32 (point C) becomes lower than a potential at the source terminal of the switching element 1 as the drain-source voltage is decreased. Consequently, the potential at the other terminal of the capacitor 32 (point C) becomes lower than a potential at one terminal of the capacitor 34 to apply a forward voltage to the diode 35, resulting in turning ON the diode 35. Then, a current flows from the capacitor 34 to the capacitor 32 until the terminal potentials of both the capacitors 32, 34 become substantially equal to each other, thus the capacitor 34 is charged.

Next, when the switching element 1 again turns ON after the switching element 1 once turns OFF, a potential at the drain terminal of the switching element 1, i.e. a potential at the one terminal of the capacitor 32 (point A), decreases to a level substantially equal to a potential at the source terminal of the switching element 1. Also in this case, a potential at the other terminal of the capacitor 32 (point C) becomes lower than the potential at the source terminal of the switching element 1, causing a current to flow in a direction from the capacitor 34 to the capacitor 32 to charge the capacitor 34, in a manner similar to the foregoing.

The energy accumulated in the leak inductance 12 is always converted into charges accumulated on the capacitor 34 through the capacitor 32 by a sequence of operations described above which are repeated together with the switching operation of the switching power supply apparatus. The form of energy as the charges accumulated on the capacitor 34 is a DC voltage which can be effectively utilized as an auxiliary power supply. In this circuit, since the DC voltage from the auxiliary power supply is supplied to the load 36, the efficiency can be enhanced. It should be noted that the utilization of the auxiliary power supply does not exert any influence on the switching operation as the main operation of the circuit.

According to the first embodiment as described above, since the auxiliary power supply circuit 31 is provided to absorb energy accumulated in the leak inductance 12 and convert this energy into a DC voltage, the accumulated energy, conventionally consumed for nothing, can be effectively utilized to enhance the efficiency of the switching power supply apparatus. In addition, a surge voltage is suppressed to prevent the generation of noise, and the switching element 1 can be protected from being broken due to high surge voltage and heat generated thereby.

Next, a second embodiment will be described with reference to FIG. 8.

Figure 8:
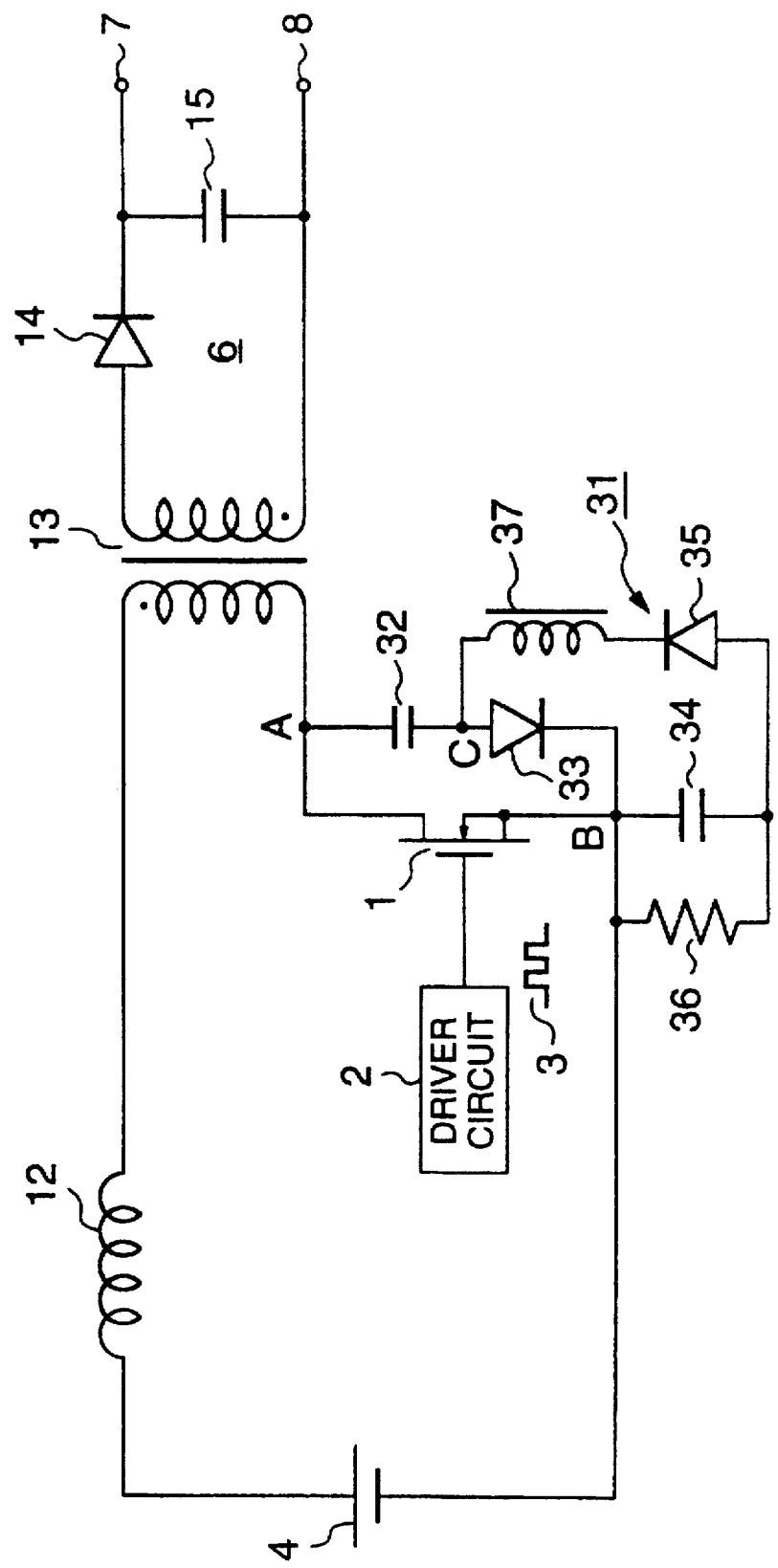
FIG. 8 is a circuit diagram illustrating a switching power supply apparatus according to a second embodiment of the present invention.

In FIG. 8, an inductor 37 is additionally connected in series between a point C and a diode 35 in an auxiliary power supply circuit 31.

In the first embodiment, when the capacitor is being charged, a difference in voltage between the capacitor 32 and the capacitor 34 causes a large current to flow through both the capacitors 32, 34, though during a short time period, thus possibly increasing power loss by an internal resistance due to this large current.

In the second embodiment, the inductor 37 is added to absorb the difference in potential between the two capacitors 32 and 34 to reduce the power loss due to the large current. The power loss reduction effect is more significant as the inductance value of the inductor 37 becomes larger, and contributes to the enhanced efficiency in the whole switching power supply apparatus.

Next, a third embodiment will be described with reference to FIG. 9.

Figure 9:
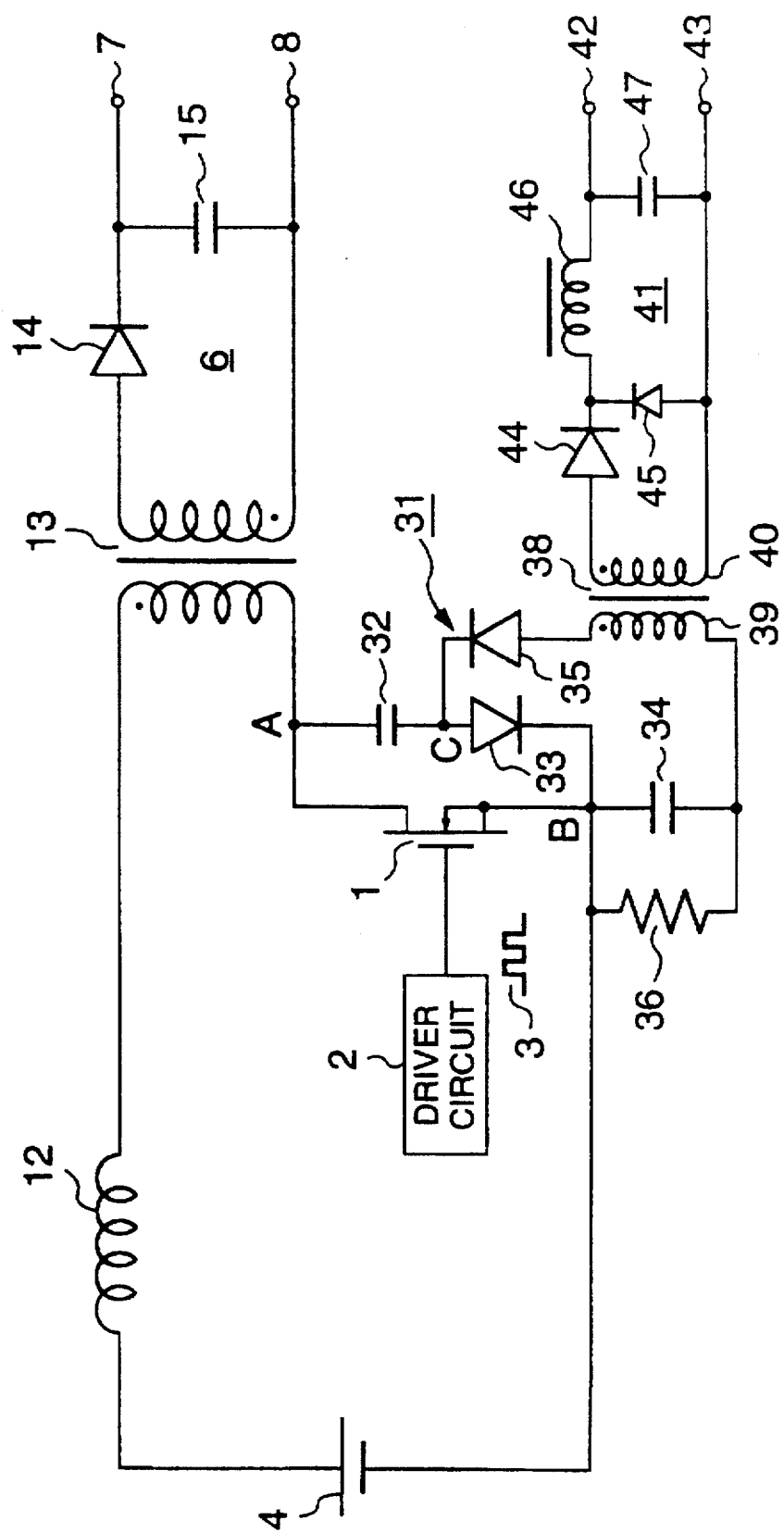
FIG. 9 is a circuit diagram illustrating a switching power supply apparatus according to a third embodiment of the present invention.

In FIG. 9, a second transformer 38 is connected to an auxiliary power supply circuit 31, where a primary winding 39 of the second transformer 38 is connected in series with a diode 35, and a second winding 40 of the same is connected to output terminals 42, 43 through a rectifying/smoothing circuit 41. The rectifying/smoothing circuit 41 includes diodes 44, 45, an inductor 46, and a capacitor 47.

While the first and second embodiments use the capacitor 34 to convert accumulated energy into a DC voltage, the third embodiment uses the second transformer 38 to convert and transmit electric power, so that the auxiliary power supply circuit 31 can be connected to the outside to utilize a voltage converted thereby. Since the output of the second transformer 38 is insulated from the remaining portion of the switching power supply apparatus, the auxiliary power supply circuit can also be utilized also for a load which may cause common mode fluctuations in voltage. Also, a desired output voltage can be supplied by selecting a winding ratio of the first winding 39 to the second winding 40 of the transformer 38.

Next, a fourth embodiment will be described with reference to FIG. 10.

Figure 10:
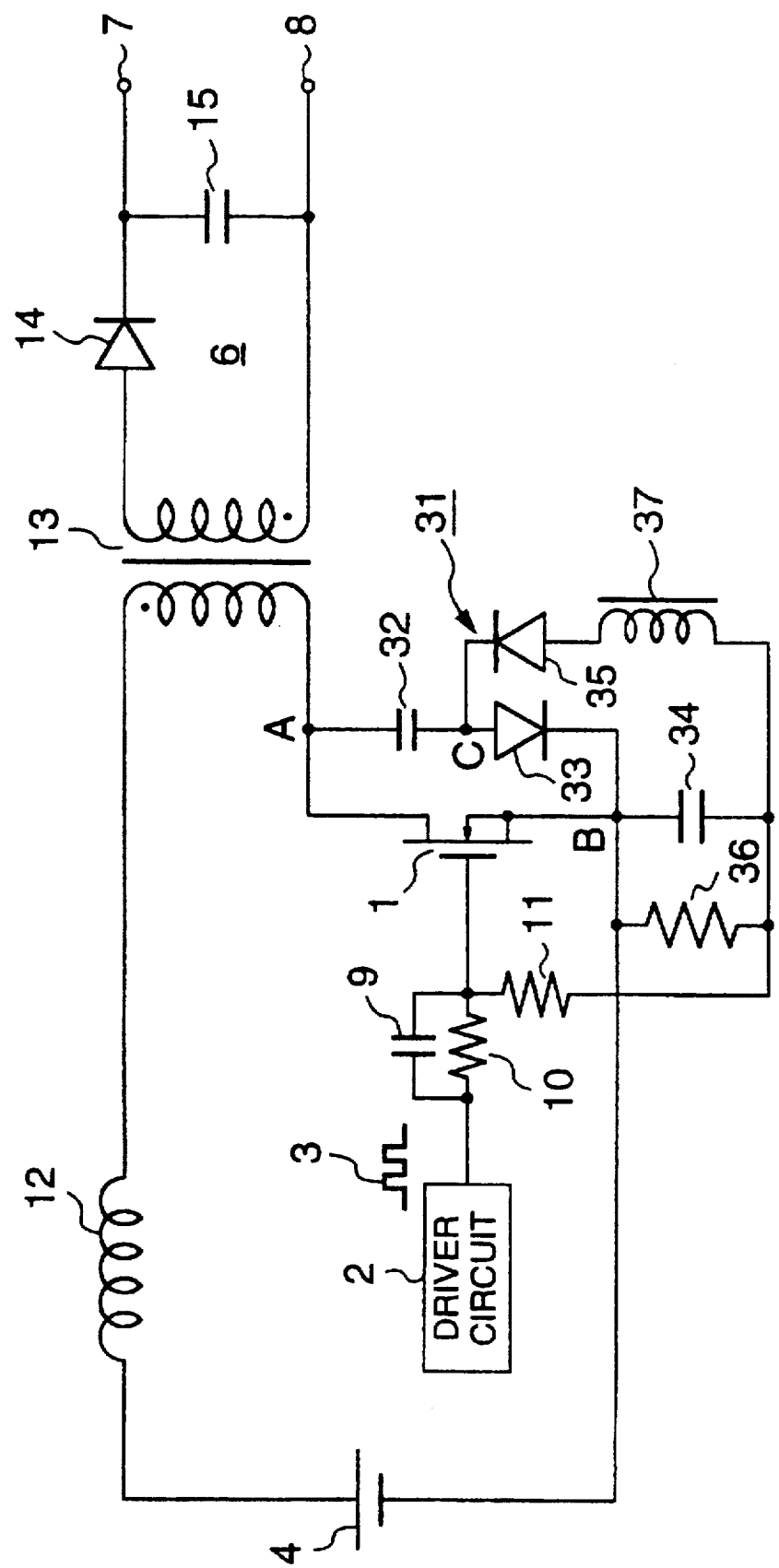
FIG. 10 is a circuit diagram illustrating a switching power supply apparatus according to a fourth embodiment of the present invention.

In FIG. 10, an inductor 37 is connected in series with diode 35 in an auxiliary power supply circuit 31, and a voltage accumulated on a capacitor 34 is applied to a control terminal of a switching element 1 through a resistor 11.

Figure 3:
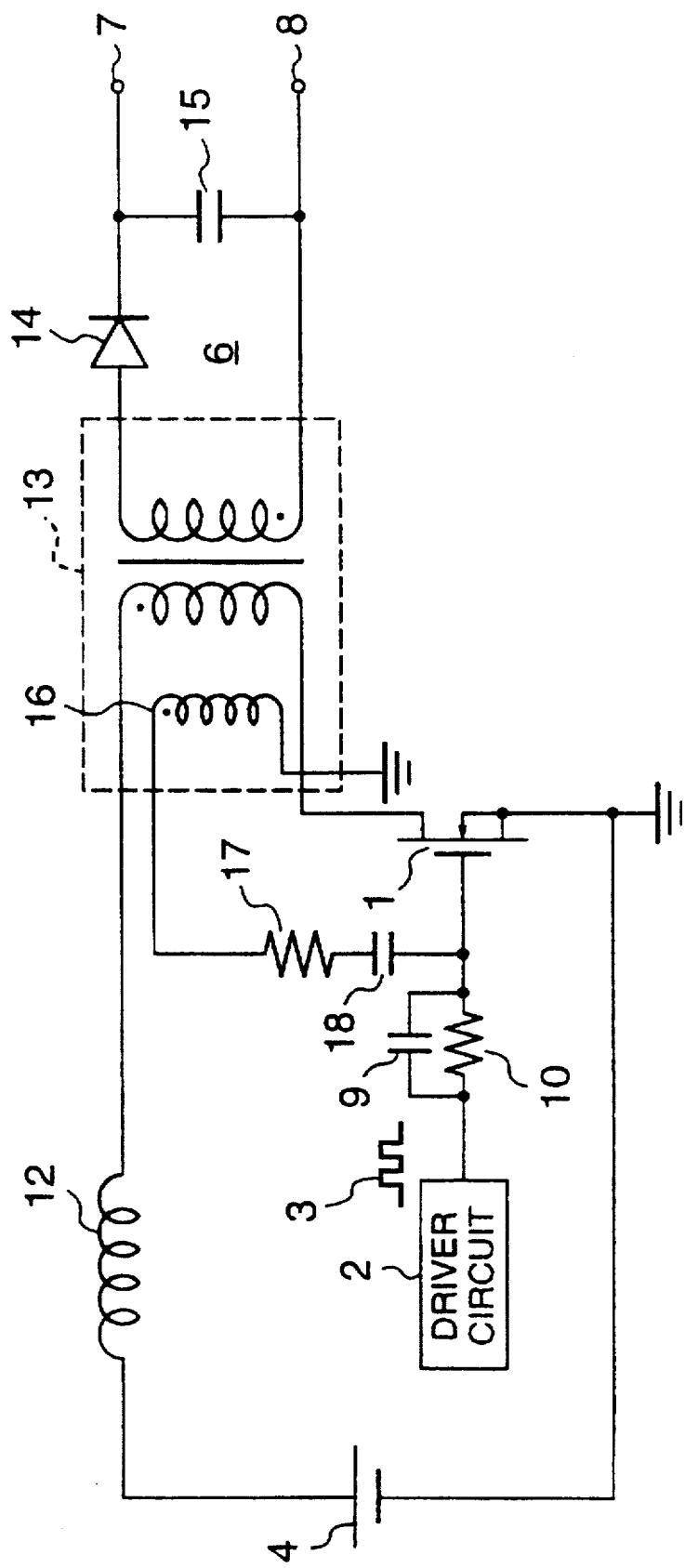
FIG. 3 is a circuit diagram illustrating another exemplary configuration of a conventional switching power supply apparatus.
Figure 4:
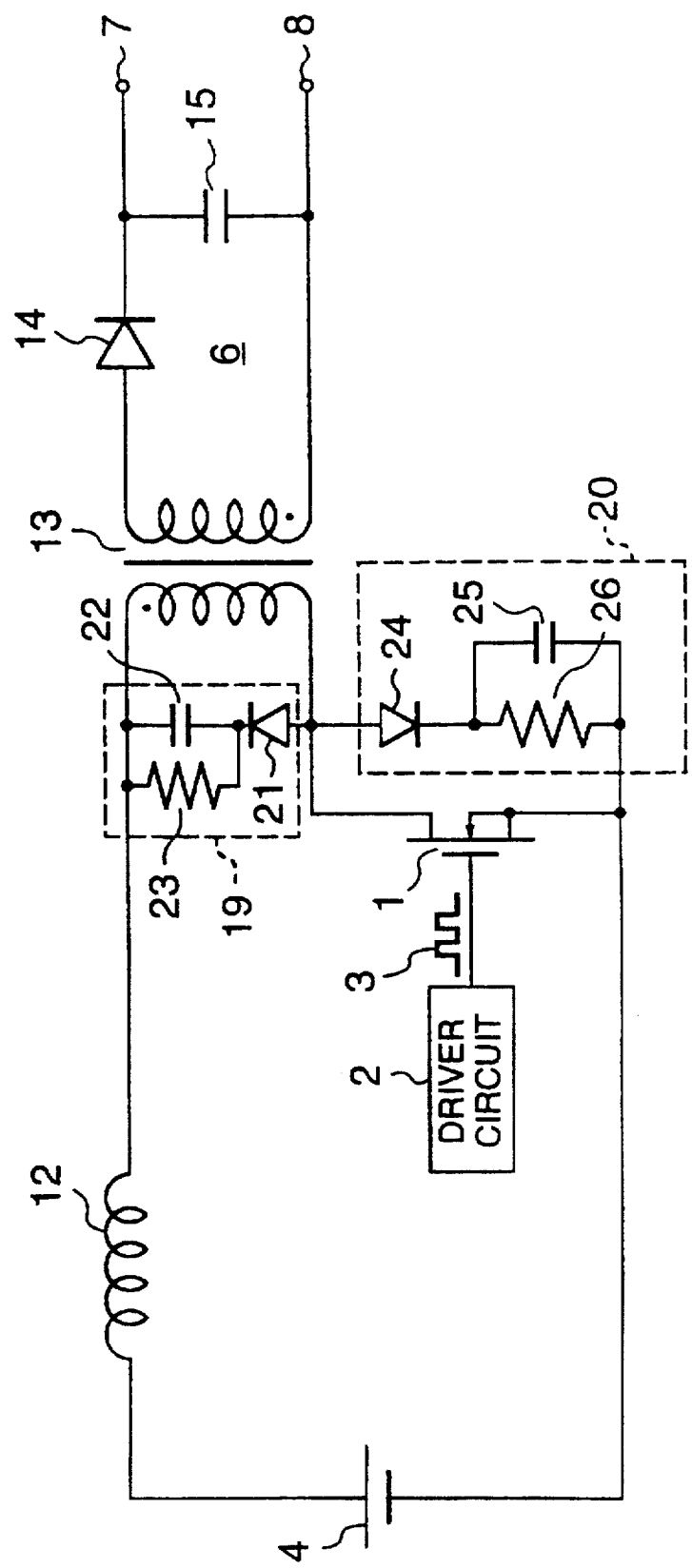
FIG. 4 is a circuit diagram illustrating a further exemplary configuration of a conventional switching power supply apparatus.
Figure 5:
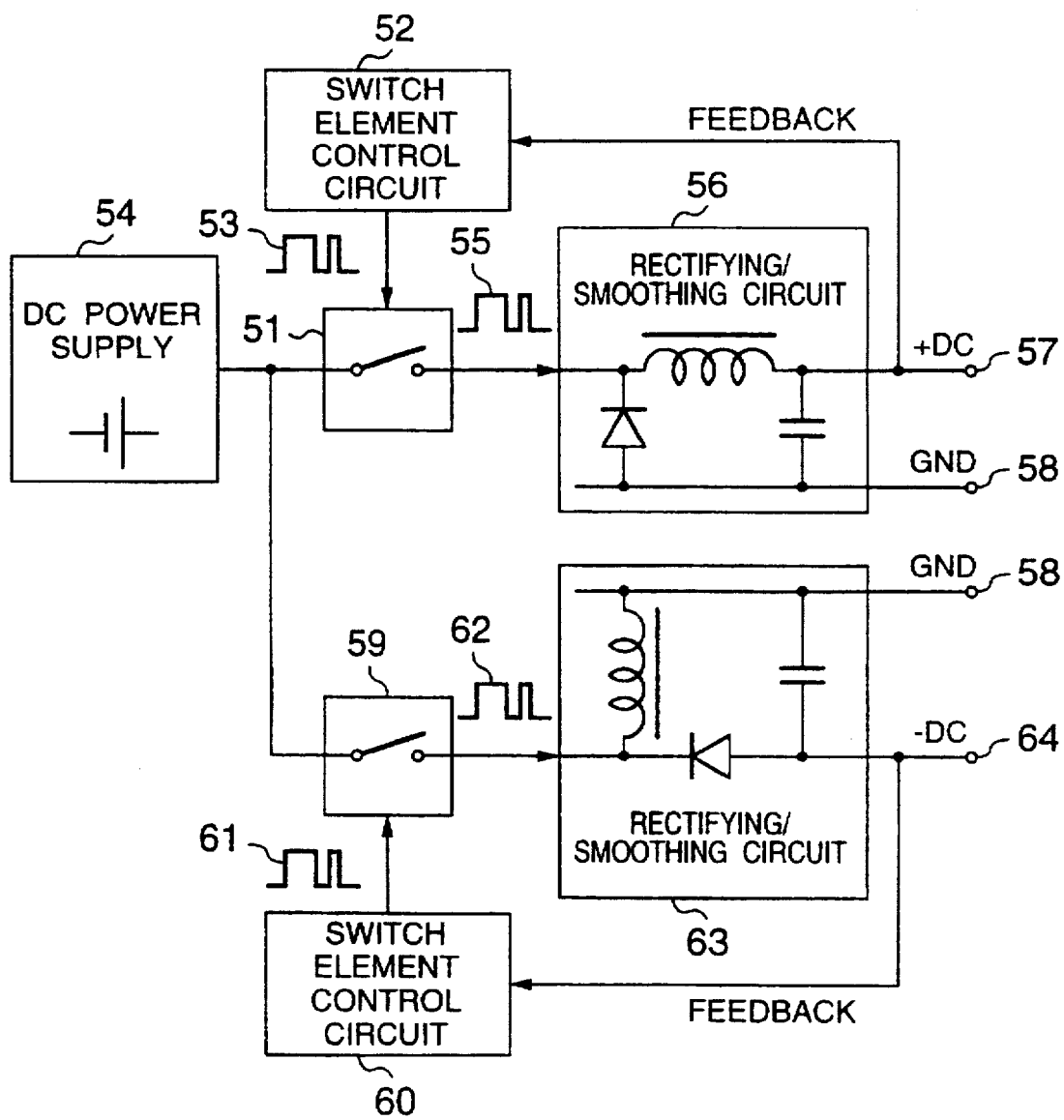
FIG. 5 is a block diagram conceptually illustrating a conventional bipolar switching power supply apparatus.

The fourth embodiment corresponds to the aforementioned art example illustrated in FIG. 3, wherein an auxiliarily voltage generated by the auxiliary power supply circuit is utilized as a voltage for extracting accumulated charges in the switching element 1.

Therefore, according to the fourth embodiment, the transformer 13 does not require the tertiary winding 16, as is the case of FIG. 3, and the accumulated energy can be effectively utilized as a voltage for extracting the accumulated charges.

It should be noted that all of the second through fourth embodiments also have the same effect as the first embodiment.

Also, while each of the first through fourth embodiments has been described in connection with a flyback switching power supply apparatus having the rectifying/smoothing circuit 6 which includes the diode 14 and the capacitor 15, the present invention may also be applied to a feed forward type switching power supply apparatus having a rectifying/smoothing circuit which includes a diode, an inductor, a capacitor, and so on.

Next, a fifth embodiment is described in which the present invention is applied to a chopper regulator switching power supply apparatus.

Figure 11:
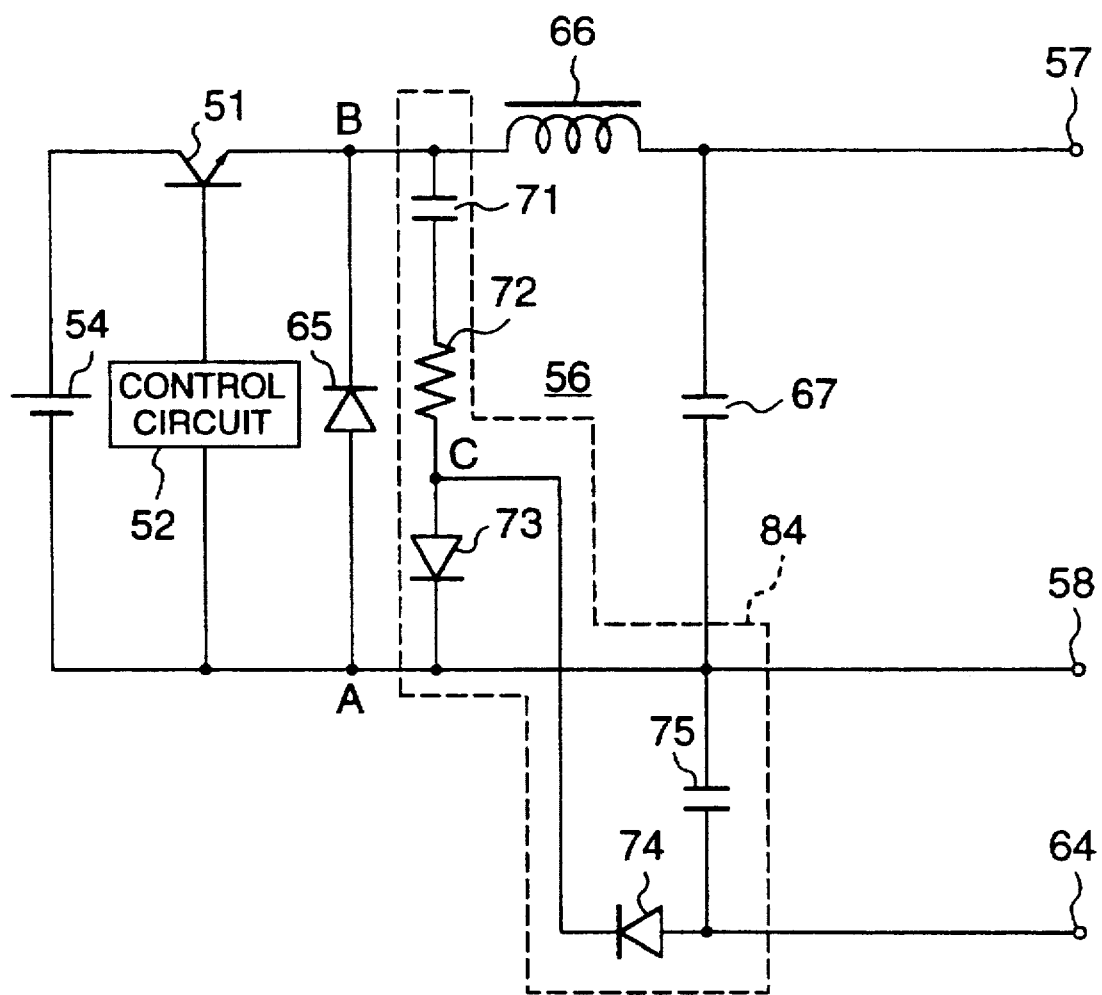
FIG. 11 is a circuit diagram illustrating a switching power supply apparatus according to a fifth embodiment of the present invention.

FIG. 11 illustrates a circuit diagram of the present invention which is applied to a buck chopper switching power supply circuit as the fifth embodiment.

In FIG. 11, a first diode 73, a resistor 72, and a first capacitor 71 are connected in series between an anode terminal or point A (reference potential) and a cathode terminal or point B of a flywheel diode 65 of a rectifying/smoothing circuit 56 in a step-down chopper switching power supply circuit. In addition, a second diode 74 and a second capacitor 75 are connected in series between a connecting point of the resistor 72 and the first diode 73 (point C) and the reference potential (point A). These capacitors 71, 75, diodes 73, 74, and resistor 72 constitute an auxiliary power supply circuit 84 for generating a negative output voltage.

The current direction of the diode 73 is opposite to the current direction of the flywheel diode 65, whereas the current direction of the diode 74 is the same as the current direction of the flywheel diode 65.

With the foregoing configuration, the fifth embodiment utilizes a voltage generated between both terminals of the capacitor 75 as a negative voltage source.

Next, the operation of the fifth embodiment configured as described above will be described referring again to FIG. 11.

First, when a transistor 51 is in ON state, a positive voltage output circuit supplies energy to a choke coil 66, a capacitor 67, and a load with an input voltage from a DC power supply 54. As a result, by a current flowing through the choke coil 66, energy is accumulated therein.

Meanwhile, in the auxiliary power supply circuit 84, as the negative voltage output circuit, a voltage between points A and B rises to make the diode 73 conductive. This allows a current from the DC power supply 54 to flow in a loop formed by the transistor 51, capacitor 71, resistor 72, and diode 73 to accumulate charges on the capacitor 71. Consequently, a voltage between the terminals of the capacitor 71 is increased. Here, the resistor 72 serves as a current limiting resistor for preventing a ripple current component from growing due to a current abruptly flowing into the capacitor 71. However, the resistor 72 may be omitted if the current flowing into the capacitor 71 is not much.

Next, when the transistor 51 turns OFF, the energy accumulated in the choke coil 66 is supplied through the flywheel diode 65 to the capacitor 67 and also to the load in the positive voltage output circuit.

At this time, in the auxiliary power supply circuit 84, a potential at point C is lower than a potential at point A due to a potential difference of the capacitor 71 on which charges are accumulated. This makes the diode 73 non-conductive and in turn the diode 74 conductive. Then, the charges accumulated on the capacitor 71 flow in a loop formed by the choke coil 66, capacitor 67, capacitor 75, diode 74, and resistor 72, resulting in a rise in voltage between the terminals of the capacitor 75. Here, the resistor 72, similar to the above-mentioned case, serves as a current limiting resistor for preventing a ripple current component from growing due to a current flowing abruptly into the capacitor 75. The energy accumulated on the capacitor 71 is moved to the capacitor 75 by the foregoing operations. In this way, a negative voltage substantially equal to an input voltage from the DC power supply 54 is generated across the capacitor 75. The voltage generated across the capacitor 75 is outputted from the output terminals 58 and 64 as a negative voltage.

The charges accumulated on the capacitor 71 are always converted into charges accumulated on the capacitor 75 by a sequence of the operations performed in the auxiliary power supply circuit 84 described above which are repeated together with the switching operation of the switching power supply apparatus. The form of energy as the charges accumulated on the capacitor 75 is a DC voltage which can be effectively utilized as an auxiliary power supply. It should be noted that the utilization of the auxiliary power supply does not exert any influence on the switching operation as the main operation of the circuit.

Also, since the switching power supply apparatus of the fifth embodiment does not include an expensive control circuit, switching element, and inductor element in the negative voltage output circuit, it can be manufactured at a cost being approximately 50–60 percent of the cost of the conventional circuit configuration.

Next, a sixth embodiment will be described with reference to FIG. 12.

Figure 12:
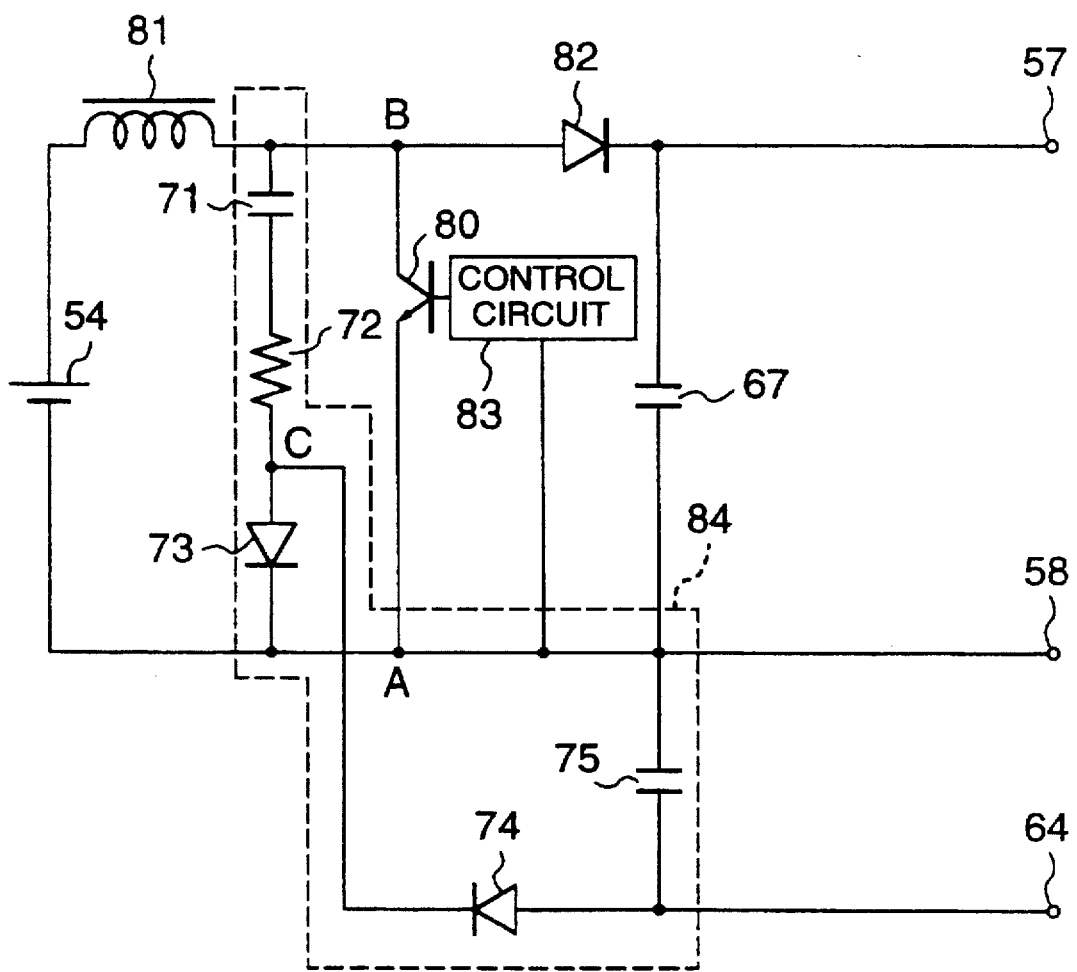
FIG. 12 is a circuit diagram illustrating a switching power supply apparatus according to a sixth embodiment of the present invention.

FIG. 12 is a circuit diagram illustrating a boost chopper switching power supply circuit to which the present invention is applied.

The boost chopper switching power supply circuit of FIG. 12 uses a transistor 80 as a switching element. A first diode 73, a resistor 72, and a first capacitor 71 are connected in series between the emitter terminal or point A (reference potential) and the collector terminal or point B of the transistor 80. Also, a second diode 74 and a second capacitor 75 are connected in series between a connecting point of the resistor 72 and the first diode 73 (point C) and the reference potential, i.e., the point A. These capacitors 71, 75, diodes 73, 74, and resistor 72 constitute an auxiliary power supply circuit 84 for generating a negative voltage. The switching of the transistor 80 is controlled by a control circuit 83, and its switching output is rectified and smoothed by a flywheel diode 82 and a capacitor 67. Further, an input voltage from a DC power supply 54 is applied to the transistor 80 through a choke coil 81.

The current direction of the diode 73 is the same as the current direction of the transistor 80, whereas the current direction of the diode 74 is opposite to the current direction of the transistor 80.

With the foregoing configuration, the sixth embodiment utilizes a voltage generated between both terminals of the capacitor 75 as a negative voltage source.

Next, the operation of the sixth embodiment configured as described above will be described referring again to FIG. 12.

When the transistor 80 is in OFF state, the diode 82 is conducted by an input voltage from the DC power supply 54 and an electromotive force of the choke coil 81 in the positive voltage output circuit, so that energy is supplied to the capacitor 67 and also to a load. In this event, a current also flows from the choke coil 81 and energy is released therefrom.

Meanwhile, in the auxiliary power supply circuit 84, as the negative voltage output circuit, a voltage between points A and B rises to conduct the diode 73. This allows a current from the DC power supply 54 to flow in a loop formed by the choke coil 81, capacitor 71, resistor 72, and diode 73 to accumulate charges on the capacitor 71. Consequently, a voltage between the terminals of the capacitor 71 is increased. Here, the resistor 72 serves as a current limiting resistor for preventing a ripple current component from growing due to a current flowing abruptly into the capacitor 71. However, the resistor 72 may be omitted if the current flowing into the capacitor 71 is not much.

Next, when the transistor 80 turns ON, a current flows through the choke coil 81 so that energy is accumulated in the choke coil 81 in the positive voltage output circuit. At this time, in the auxiliary power supply circuit 84, a potential at point C is lower than a potential at point A due to a potential difference of the capacitor 71, on which charges are accumulated, to make the diode 74 conductive this time. Then, the charges accumulated on the capacitor 71 flow in a loop formed by the transistor 80, capacitor 75, diode 74 and resistor 72, resulting in a rise in voltage between the terminals of the capacitor 75. Here, the resistor 72, similarly to the above-mentioned case, serves as a current limiting resistor for preventing a ripple current component from growing due to a current flowing abruptly into the capacitor 75. The energy accumulated on the capacitor 71 is moved to the capacitor 75 by the foregoing operations. In this way, a negative voltage substantially equal to an output voltage generated in the positive voltage output circuit is generated across the capacitor 75. The voltage generated across the capacitor 75 is outputted from the output terminals 58 and 64 as a negative voltage.

The charges accumulated on the capacitor 71 are always converted into charges accumulated on the capacitor 75 by a sequence of the operations performed in the auxiliary power supply circuit 84 described above which are repeated together with the switching operation of the switching power supply apparatus. The form of energy as the charges accumulated on the capacitor 75 is a DC voltage which can be effectively utilized as an auxiliary power supply. It should be noted that the utilization of the auxiliary power supply does not exert any influence on the switching operation as the main operation of the circuit.

Also, since the switching power supply apparatus of the sixth embodiment does not include an expensive control circuit, switching element, or inductor element in the negative voltage output circuit, it can be manufactured at a cost approximately 50–60 percent the cost of the conventional circuit configuration.

Figure 17:
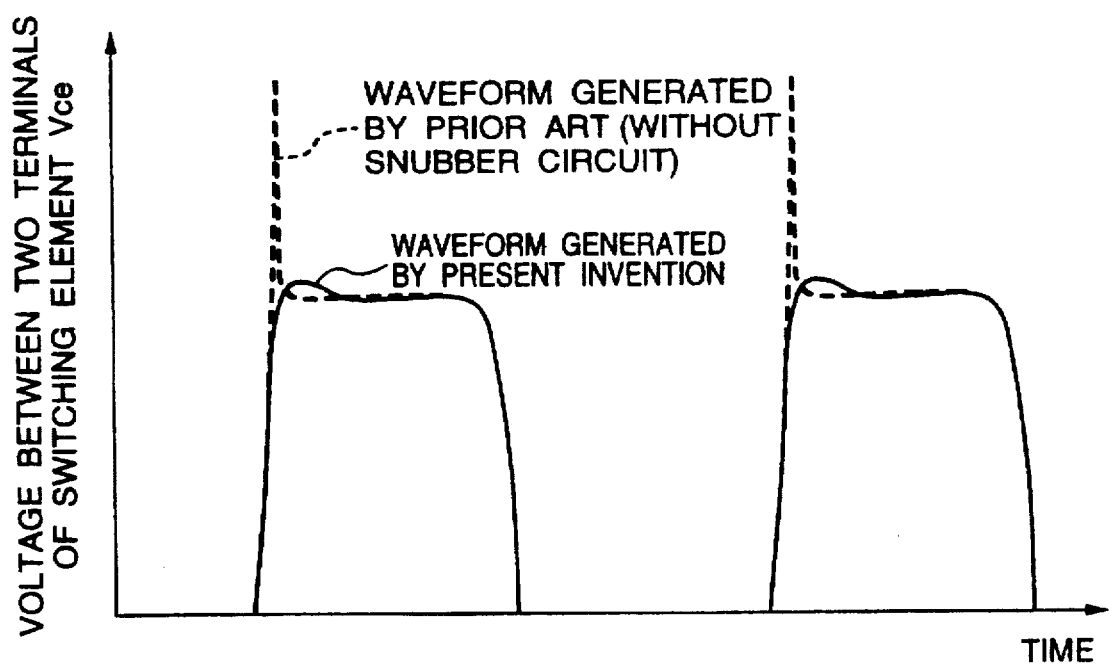
FIG. 17 shows waveform charts for indicating the difference in switching waveforms between a conventional switching power supply apparatus and the switching power supply apparatus according to the present invention.

Additionally, according to the sixth embodiment, since the first capacitor 71, the resistor 72, and the first diode 73, constituting the auxiliary power supply circuit 84, are connected in series between the two terminals of the transistor 80, the switching power supply apparatus can also absorb energy of noise possibly generated when the transistor 80 turns OFF, as illustrated in a waveform chart of FIG. 17. With this additional effect, the auxiliary power supply circuit 84 can be utilized as a snubber circuit to prevent the switching element from being broken due to an accidental surge voltage.

Next, a seventh embodiment will be described with reference to FIG. 13.

Figure 13:
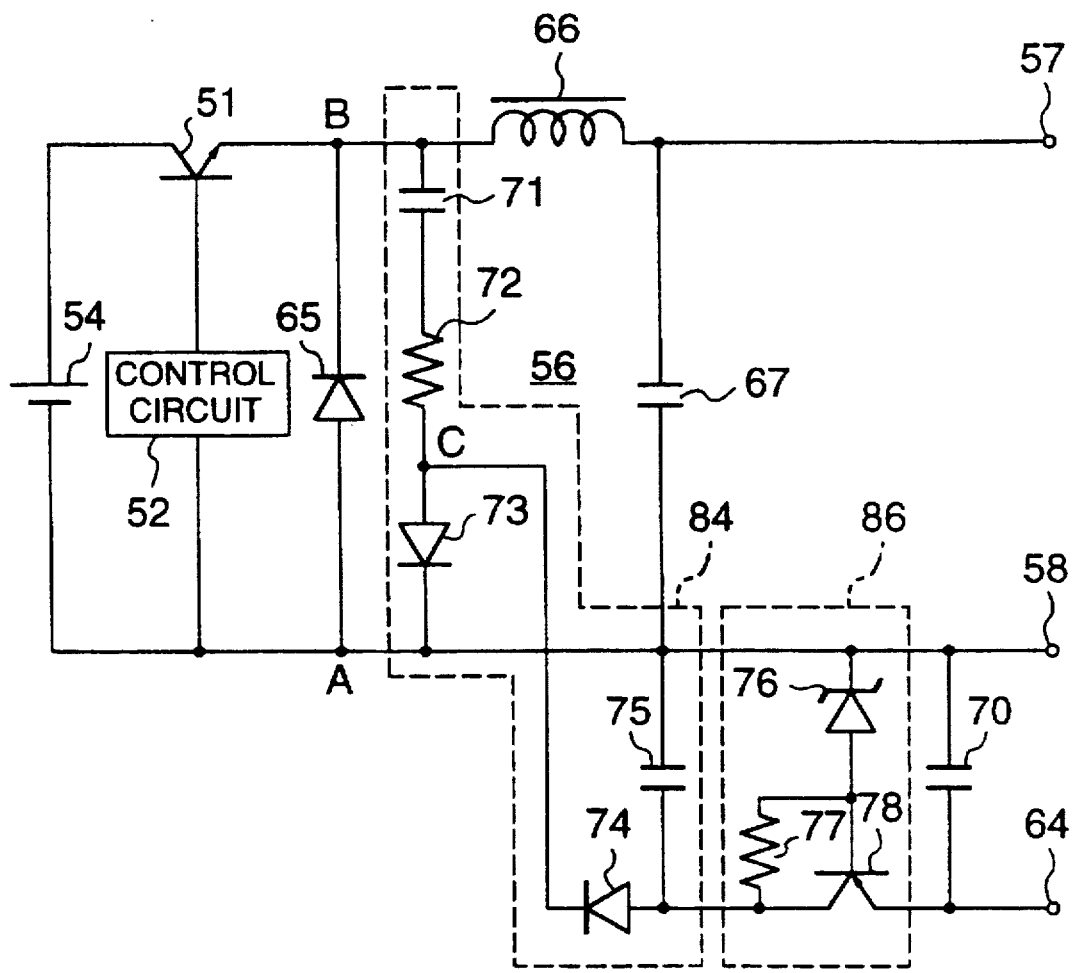
FIG. 13 is a circuit diagram illustrating a switching power supply apparatus according to a seventh embodiment of the present invention.

FIG. 13 illustrates a circuit diagram of a switching power supply apparatus which has a dropper regulator 86 for stabilizing a negative voltage generated by the auxiliary power supply circuit 84 of the fifth embodiment in FIG. 11.

In FIG. 13, in addition to the circuit configuration previously illustrated in FIG. 11, the dropper regulator 86 including a zener diode 76, a resistor 77, and a transistor 78 is added between a capacitor 75 and a capacitor 70 as a voltage stabilizing means. This dropper regulator 86 readjusts an output voltage from an auxiliary power supply circuit 84 to a target voltage which is then smoothed by a capacitor 70, thus outputting a stable voltage.

The seventh embodiment compensates for the characteristic of the auxiliary power supply circuit 84 which can only provide a range of output negative voltages substantially equal to a range of voltages from an input power supply, thereby making it possible to output a target required voltage in a more stable form. It should be noted that the utilization of the auxiliary power supply does not exert any influence on the switching operation as the main operation of the circuit.

In addition, since the switching power supply apparatus of the seventh embodiment does not include an expensive control circuit, switching element, or inductor element in the negative voltage output circuit, it can be manufactured at a cost being approximately 60–70 percents as much as the cost of the conventional circuit configuration.

Next, an eighth embodiment will be described with reference to FIG. 14.

Figure 14:
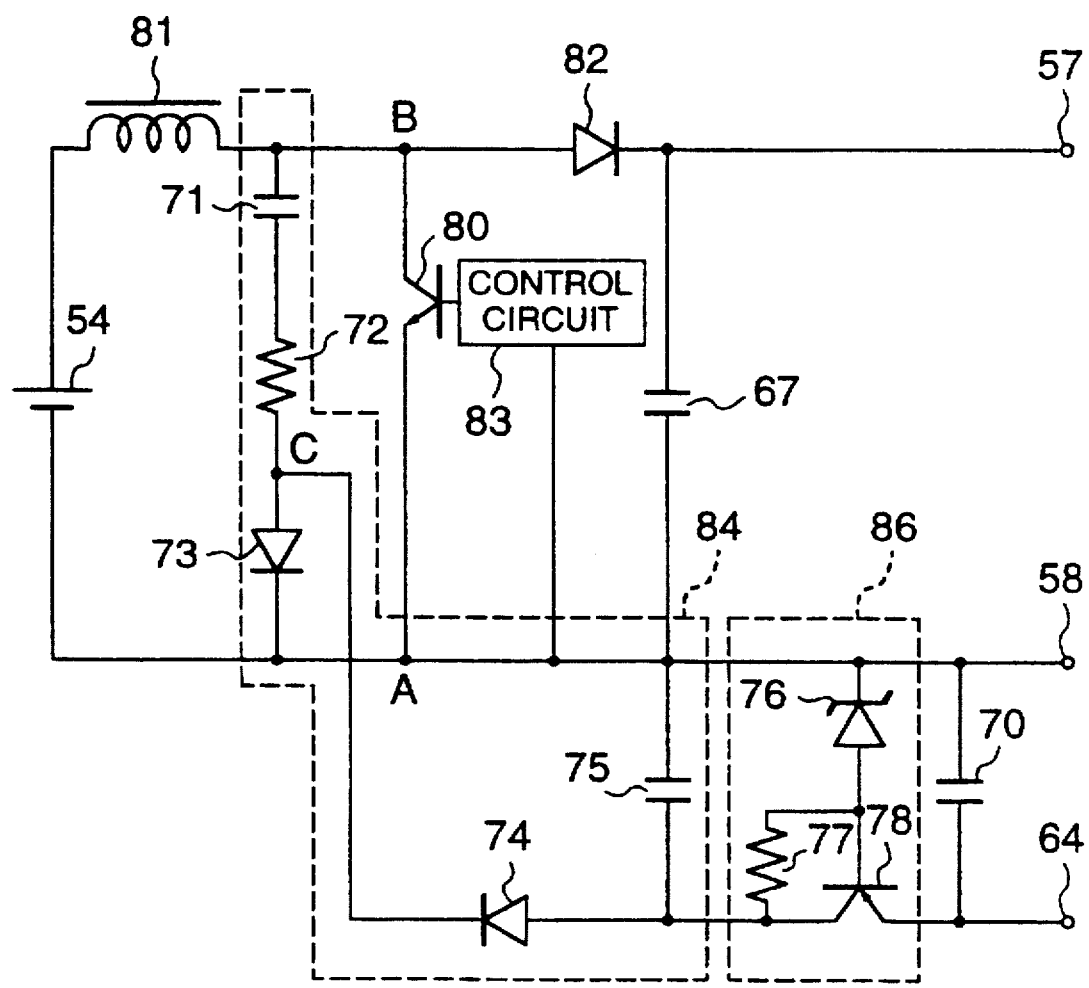
FIG. 14 is a circuit diagram illustrating a switching power supply apparatus according to an eighth embodiment of the present invention.

FIG. 14 illustrates a circuit diagram of a switching power supply apparatus which has a dropper regulator 86 for stabilizing a negative voltage generated by the auxiliary power supply circuit 84 of the sixth embodiment in FIG. 12.

In FIG. 14, in addition to the circuit configuration previously illustrated in FIG. 12, the dropper regulator 86 including a zener diode 76, a resistor 77, and a transistor 78 is added between a capacitor 75 and a capacitor 70 in order to readjust an output voltage from an auxiliary power supply circuit 84 to a target required voltage which is then smoothed by a capacitor 70, thus outputting a stable voltage.

The eighth embodiment compensates for the characteristic of the auxiliary power supply circuit 84 which can only provide a range of output negative voltages substantially equal to a range of output voltages from a positive power supply circuit, thereby making it possible to output a target required voltage in a more stable form. It should be noted that the utilization of the auxiliary power supply does not exert any influence on the switching operation as the main operation of the circuit.

In addition, since the switching power supply apparatus of the eighth embodiment does not include an expensive control circuit, switching element, or inductor element in the negative voltage output circuit, it can be manufactured at a cost being approximately 60–70 percent of the cost of the conventional circuit configuration.

Next, a ninth embodiment will be described with reference to FIG. 15.

Figure 6:
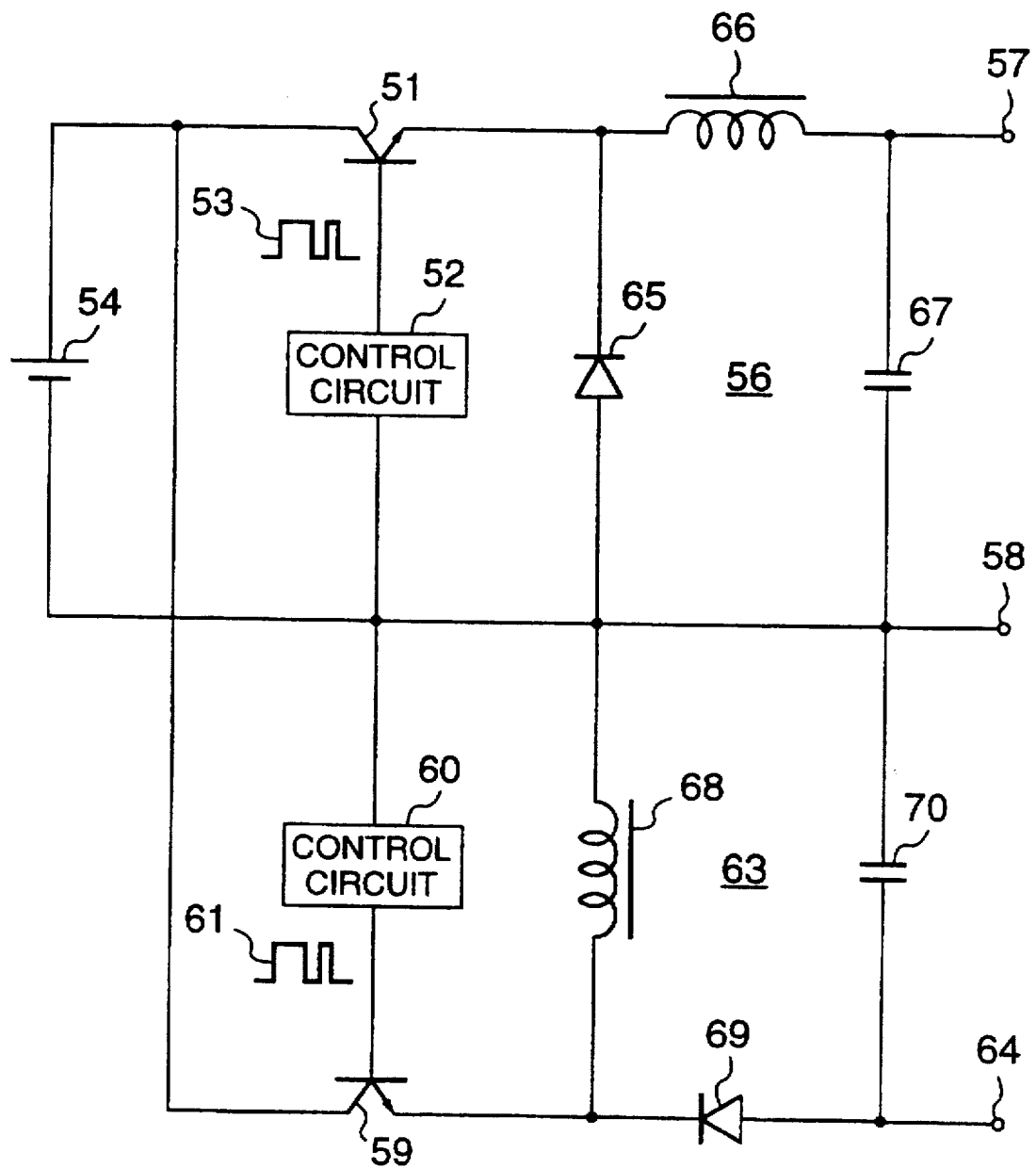
FIG. 6 is a circuit diagram illustrating an exemplary configuration of the conventional bipolar switching power supply apparatus.
Figure 15:
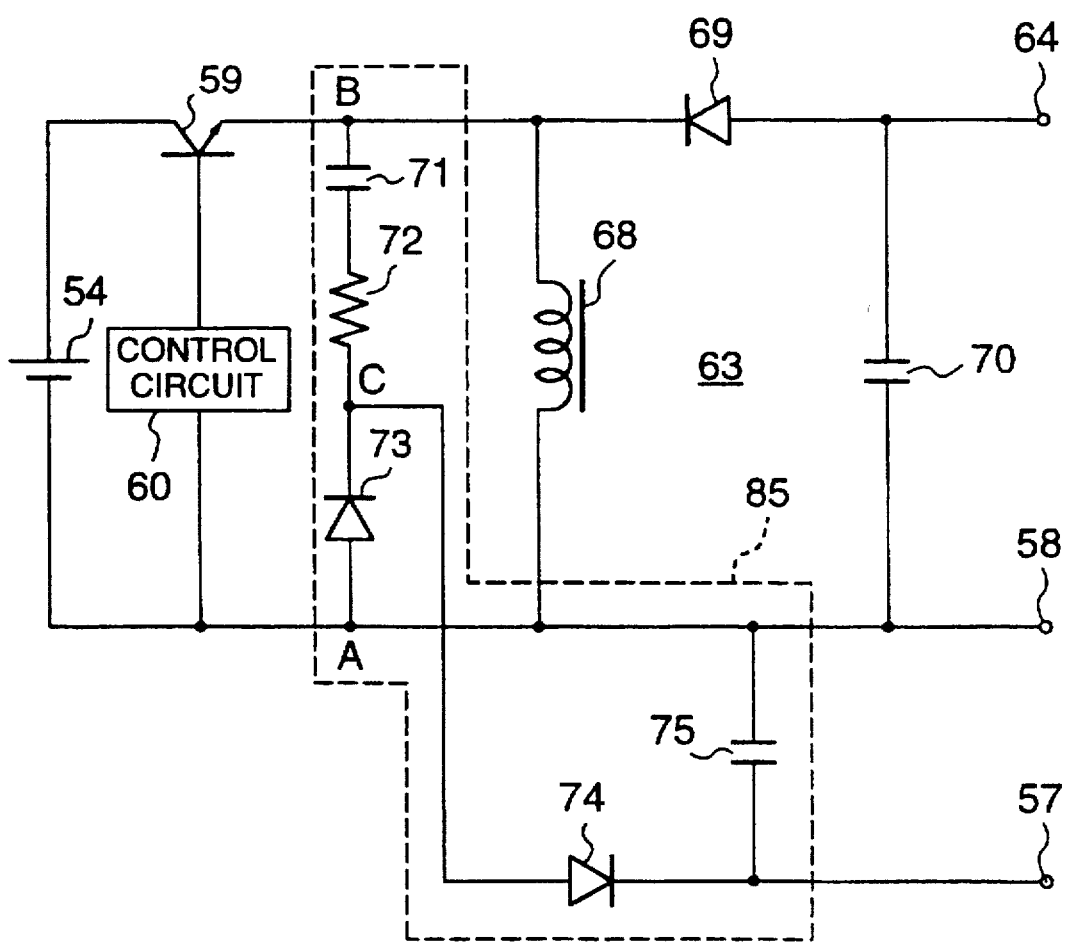
FIG. 15 is a circuit diagram illustrating a switching power supply apparatus according to a ninth embodiment of the present invention.

FIG. 15 illustrates a buck-boost chopper switching power supply circuit for generating a negative voltage output, as previously described with reference to FIG. 6, which additionally comprises an auxiliary power supply circuit 85.

Diodes 73, 74 in the auxiliary power supply circuit 85 are connected in reverse with respect to the diodes 73, 74 in the auxiliary power supply circuits in FIGS. 11–14.

With the foregoing configuration, the ninth embodiment utilizes a voltage generated between both ends of a capacitor 75 as a positive voltage source.

Next, the operation of the ninth embodiment configured as described above will be described referring again to FIG. 15.

First, when a transistor 59 turns OFF, energy accumulated in a choke coil 68 is supplied through a flywheel diode 69 to a capacitor 70 and also to a load in a negative voltage output circuit.

Meanwhile, in the auxiliary power supply circuit 85 as a positive voltage output circuit, a potential at point B is lower than a potential at point A due to a potential difference of the choke coil 68 in which the energy is accumulated, so that the diode 73 is conducted to cause a current to flow through a loop formed by the choke coil 68, diode 73, resistor 72, and capacitor 71, and consequently charges are accumulated on the capacitor 71. Here, the resistor 72 serves as a current limiting resistor for preventing a ripple current component from growing due to a current flowing abruptly into the capacitor 71. However, the resistor 72 may be omitted if the current flowing into the capacitors 71, 75 is not much.

Next, when the transistor 59 is in ON state, a current flows through the choke coil 68 so that energy is accumulated in the choke coil 68 in the negative voltage output circuit.

In this regards, in the auxiliary power supply circuit 85, a voltage between points A and B rises to make the diode 73 non-conductive and the diode 74 conductive. Thus, together with charges accumulated on the capacitor 71 during the OFF state of the transistor 59, a current from a DC power supply 54 flows through a loop formed by the transistor 59, capacitor 71, resistor 72, diode 74, and capacitor 75 to supply energy to the capacitor 75 and also to the load. Here, the resistor 72, similar to the above-mentioned case, serves as a current limiting resistor for preventing a ripple current component from growing due to a current flowing abruptly into the capacitors 71, 75. The energy accumulated on the capacitor 71 and the energy from the DC power supply 54 are moved to the capacitor 75 by the foregoing operations. In this way, a positive voltage larger than an input voltage from the DC power supply 54 is generated across the capacitor 75. The voltage generated across the capacitor 75 is outputted from the output terminals 57, 58 as a positive voltage.

The charges accumulated on the capacitor 71 are always converted into charges accumulated on the capacitor 75 by a sequence of operations performed in the auxiliary power supply circuit 85 described above which are repeated together with the switching operation of the switching power supply apparatus. The form of energy as the charges accumulated on the capacitor 75 is a DC voltage which can be effectively utilized as an auxiliary power supply. It should be noted that the utilization of the auxiliary power supply does not exert any influence on the switching operation as the main operation of the circuit.

Also, since the switching power supply apparatus of the ninth embodiment does not include an expensive control circuit, switching element, or inductor element in the negative voltage output circuit, it can be manufactured at a cost approximately 50-60 percents as much as the cost of the conventional circuit configuration.

Figure 16:
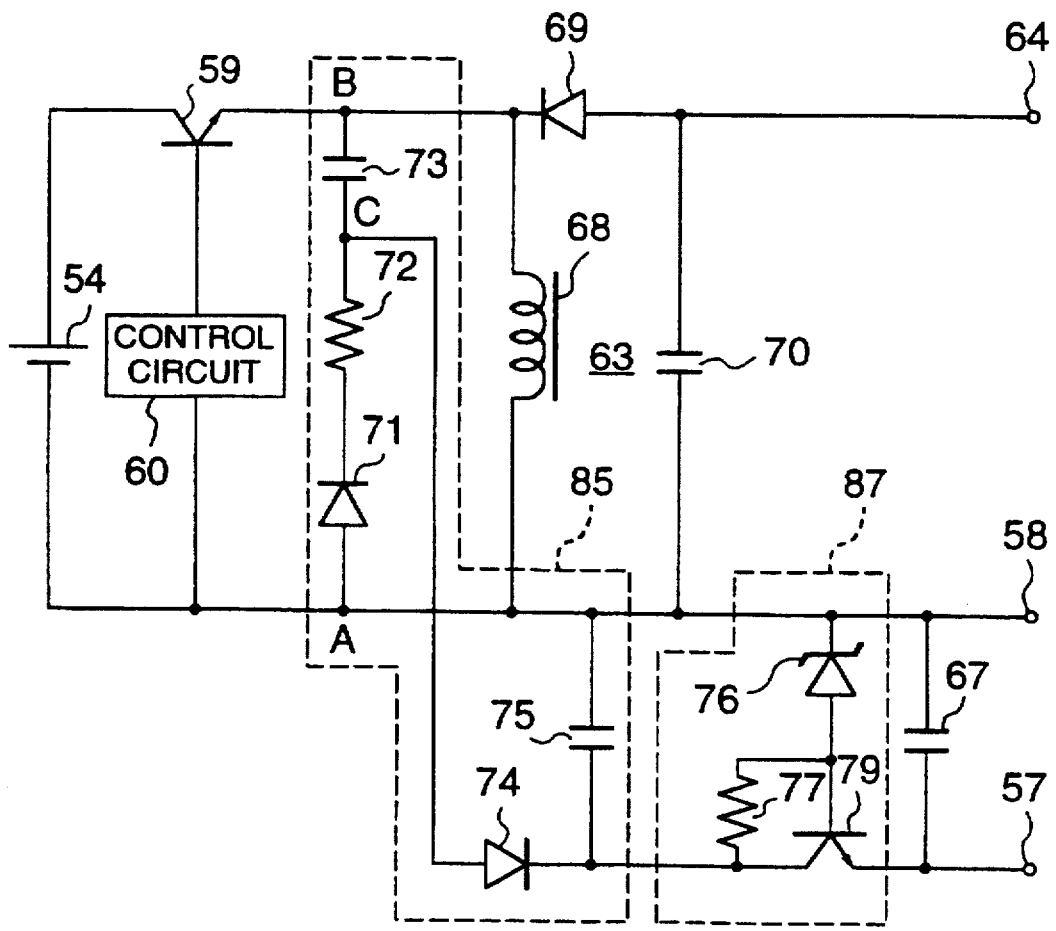
FIG. 16 is a circuit diagram illustrating a switching power supply apparatus according to a tenth embodiment of the present invention.

FIG. 16 illustrates a tenth embodiment, where a positive voltage output generated across the capacitor 75 in FIG. 15 is stabilized by a dropper regulator 87 composed of a transistor 79, a zener diode 76, and a resistor 77, smoothed by a capacitor 67, and outputted.

According to the ninth and tenth embodiments as described above, a positive voltage output of a small capacity can be generated with a simple circuit configuration without relying on a boost or buck chopper switching power supply circuit.

We claim:

1. A switching power supply apparatus comprising:

switching means, having at least a first terminal and a second terminal, for switching a direct current (DC) voltage applied at said first terminal to generate a rectangular wave voltage at said second terminal;

a flywheel diode having a first terminal connected to the second terminal of said switching means and a second terminal connected to a reference potential;

a smoothing circuit for smoothing the rectangular wave voltage generated by said switching means;

at least a first capacitor and a first diode connected in series between the first terminal of said flywheel diode and said reference potential, said first diode having a first terminal having the same polarity as that of the first terminal of said flywheel diode and a second terminal having the same polarity as that of the second terminal of said flywheel diode, the first terminal of said first diode being connected to said reference potential; and at least a second diode and a second capacitor, connected in series between the second terminal of said first diode and said reference potential.

2. A switching power supply apparatus according to claim 1, further comprising a resistor connected in series with said first capacitor and said first diode.

3. A switching power supply apparatus according to claim 1, wherein said switching power supply apparatus constitutes a buck chopper switching power supply circuit.

4. A switching power supply apparatus according to claim 1, further comprising voltage stabilizing means for stabilizing and outputting a voltage accumulated across said second capacitor.

5. A switching power supply apparatus according to claim 1, wherein the first terminal of said flywheel diode and of said first diode is a cathode terminal and the second terminal of said flywheel diode and of said first diode is an anode terminal.

6. A switching power supply apparatus according to claim 5, wherein a cathode terminal of said second diode is connected to said anode terminal of said first diode.

\* \* \* \* \*